United States Patent
Doll

(10) Patent No.: US 10,620,067 B2
(45) Date of Patent: Apr. 14, 2020

(54) FORCE-TORQUE SENSOR AND STRAIN GAGE SYSTEM AND PRINTED CIRCUIT BOARD ARRANGEMENT FOR SUCH A FORCE-TORQUE SENSOR

(71) Applicant: DR. DOLL ENGINEERING GMBH, Schwaigern (DE)

(72) Inventor: Theo Doll, Schwaigern (DE)

(73) Assignee: DR. DOLL ENGINEERING GMBH, Schwaigern (DE)

(*) Notice: Subject to any disclaimer, the term of this patent is extended or adjusted under 35 U.S.C. 154(b) by 124 days.

(21) Appl. No.: 15/750,637

(22) PCT Filed: Aug. 4, 2016

(86) PCT No.: PCT/EP2016/068642
§ 371 (c)(1),
(2) Date: Feb. 6, 2018

(87) PCT Pub. No.: WO2017/025428
PCT Pub. Date: Feb. 16, 2017

(65) Prior Publication Data
US 2019/0025143 A1    Jan. 24, 2019

(30) Foreign Application Priority Data

Aug. 7, 2015    (DE) .................. 10 2015 215 099

(51) Int. Cl.
*G01L 5/16*    (2020.01)
*G01L 5/161*   (2020.01)
(Continued)

(52) U.S. Cl.
CPC ............. *G01L 5/161* (2013.01); *B25J 13/085* (2013.01); *G01L 1/2206* (2013.01);
(Continued)

(58) Field of Classification Search
CPC ......... G01L 5/161; G01L 5/162; G01L 5/163; G01L 5/226; G01L 5/228
(Continued)

(56) References Cited

U.S. PATENT DOCUMENTS 3,448,424 A    6/1969  Laimins
4,079,624 A  * 3/1978  Kurtz ..................... G01L 1/18
                                                         73/781
(Continued)

FOREIGN PATENT DOCUMENTS

DE    1 698 113 A1    6/1971
DE    102 17 019 C1    7/2003
(Continued)

OTHER PUBLICATIONS

International Search Report with English translation issued in Application No. PCT/EP2016/068642 dated Jan. 2, 2017 (11 pages).
(Continued)

*Primary Examiner* — Lisa M Caputo
*Assistant Examiner* — Tran M. Tran
(74) *Attorney, Agent, or Firm* — Flynn Thiel, P.C.

(57) ABSTRACT

A force-torque sensor for capturing forces and torques in a robotic unit, including a one-part carrier body which has a cylindrical basic shape and is provided with two connection disks parallel to one another and at least three bridge elements which connect the connection disks to one another and are each assigned at least one measuring point, each bridge element having a central cylindrical bore as a measuring point. Each bridge element is provided, on its opposite outer edges, with a respective concave recess at which a further measuring point is respectively provided.

17 Claims, 10 Drawing Sheets

Figure 1:
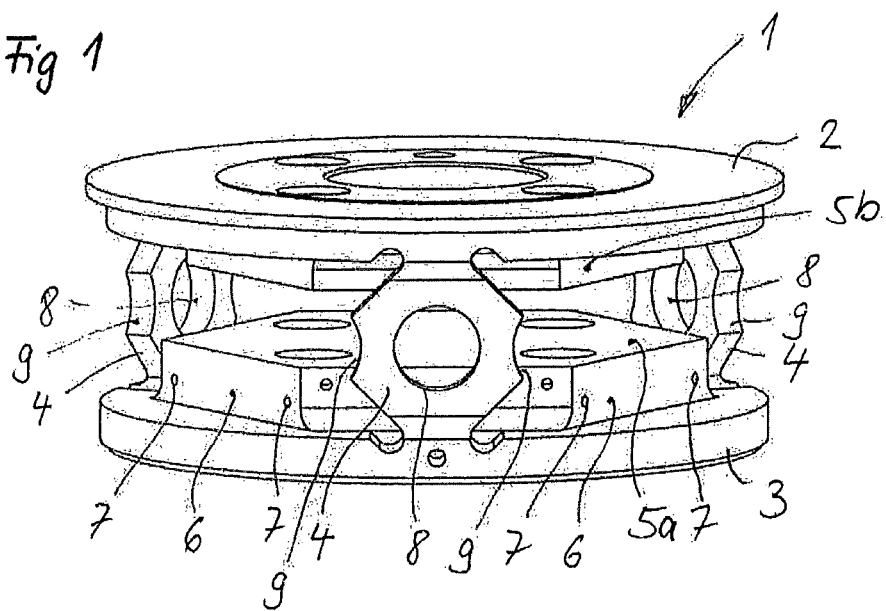

(51) Int. Cl.
*B25J 13/08* (2006.01)
*G01L 1/22* (2006.01)
*G01L 3/14* (2006.01)
*H05K 1/02* (2006.01)
*H05K 1/14* (2006.01)
*G01L 5/22* (2006.01)

(52) U.S. Cl.
CPC .......... *G01L 3/1457* (2013.01); *G01L 5/226* (2013.01); *H05K 1/028* (2013.01); *H05K 1/148* (2013.01)

(58) Field of Classification Search
USPC .................................................... 73/862.043
See application file for complete search history.

(56) References Cited

U.S. PATENT DOCUMENTS

| | | | |
|---|---|---|---|
| 4,094,192 A * | 6/1978 | Watson | G01L 5/161 73/862.044 |
| 4,196,337 A * | 4/1980 | Jewett | G01L 3/1457 219/121.35 |
| 4,478,089 A | 10/1984 | Aviles et al. | |
| 4,488,441 A * | 12/1984 | Ramming | G01L 5/161 73/862.044 |
| 4,573,362 A * | 3/1986 | Amlani | G01L 1/2218 73/862.044 |
| 4,706,506 A * | 11/1987 | Lestelle | B25J 13/085 73/862.044 |
| 4,712,431 A * | 12/1987 | Hatamura | G01L 1/2218 73/862.042 |
| 4,763,531 A | 8/1988 | Dietrich et al. | |
| 4,823,618 A * | 4/1989 | Ramming | B25J 13/085 73/862.044 |
| 4,849,730 A * | 7/1989 | Izumi | G01L 1/18 73/862.044 |
| 4,911,024 A * | 3/1990 | McMaster | G01L 5/161 73/862.044 |
| 4,928,206 A | 5/1990 | Porter et al. | |
| 5,063,788 A | 11/1991 | Ch'Hayder et al. | |
| 5,222,400 A * | 6/1993 | Hilton | G01L 1/248 73/862.043 |
| 5,315,882 A * | 5/1994 | Meyer | G01L 5/161 73/862.042 |
| 5,490,427 A * | 2/1996 | Yee | G01L 5/161 73/767 |
| 5,648,617 A * | 7/1997 | Cullen | G01L 1/2231 73/862.042 |
| 6,269,702 B1 * | 8/2001 | Lambson | G01L 3/108 73/862.045 |
| 6,439,063 B1 * | 8/2002 | Schnackenberg | G01L 5/161 73/862.041 |
| 6,792,815 B2 | 9/2004 | McDearmon et al. | |
| 6,804,012 B2 * | 10/2004 | Gombert | G01D 5/34 73/514.26 |
| 6,871,552 B2 | 3/2005 | Liu et al. | |
| 7,437,954 B2 * | 10/2008 | Sakano | G01L 5/161 73/862.043 |
| 7,552,644 B2 * | 6/2009 | Haase | G01L 1/2287 73/760 |
| 8,250,935 B2 * | 8/2012 | Meuter | G01L 3/1457 73/862.045 |
| 8,904,883 B2 * | 12/2014 | Clegg | G01L 3/1457 73/862.08 |
| 9,127,997 B2 * | 9/2015 | Mehlmauer | G01L 5/161 |
| 10,239,213 B1 * | 3/2019 | Reich | B25J 13/085 |
| 10,422,707 B2 * | 9/2019 | Bradford | G01L 5/161 |
| 2003/0150276 A1 | 8/2003 | Christensen et al. | |
| 2009/0007696 A1 * | 1/2009 | Morimoto | G01L 1/2218 73/862.045 |

FOREIGN PATENT DOCUMENTS

| | | |
|---|---|---|
| DE | 102 17 018 A1 | 11/2003 |
| DE | 103 47 812 A1 | 5/2005 |
| DE | 10 2007 017 862 A1 | 10/2008 |
| EP | 0 261 071 | 3/1988 |
| EP | 1 445 596 A1 | 8/2004 |
| GB | 962082 | 6/1964 |
| JP | 2-268237 A | 11/1990 |

OTHER PUBLICATIONS

Written Opinion of International Searching Authority issued in Application No. PCT/EP2016/068642 dated Jan. 2, 2017.
Office Action of German Patent Office issued in Application No. 10 2015 215 099.2 dated Mar. 3, 2016 (4 pages).
T.A. Dwarakanath, Gaurav Bhutani Article, "Beam Type Hexapod Structure Based Six Component Force-Torque Sensor", Mechatronics 21 (2011) 1279-1287 (9 pages).

* cited by examiner

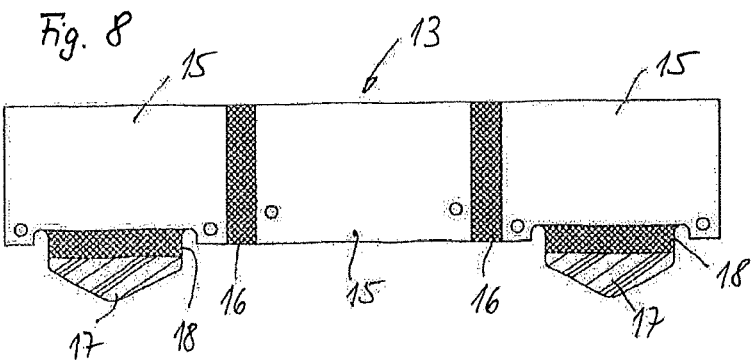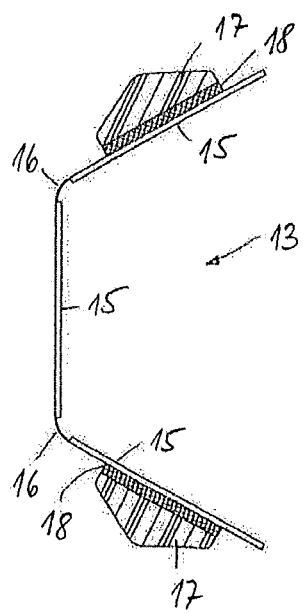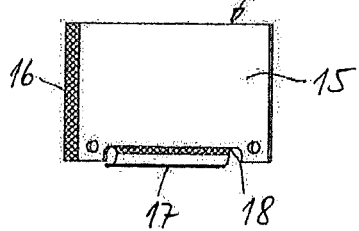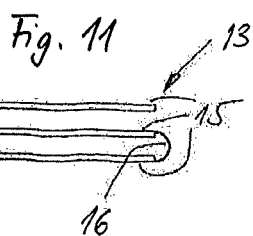

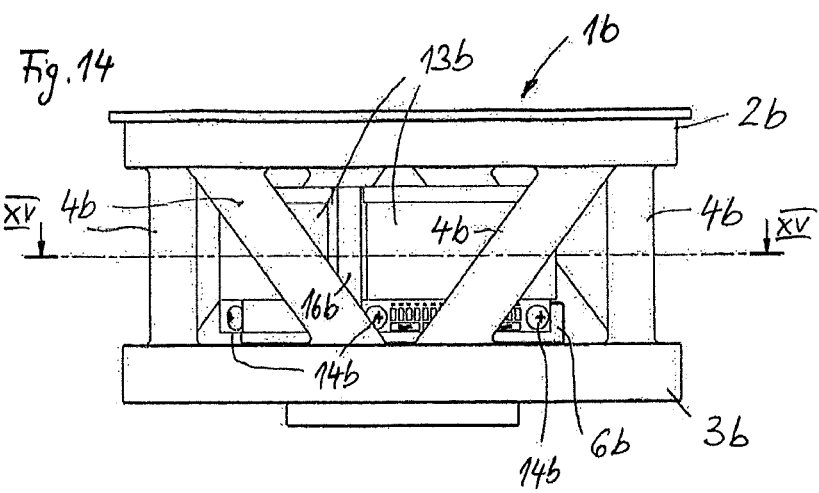
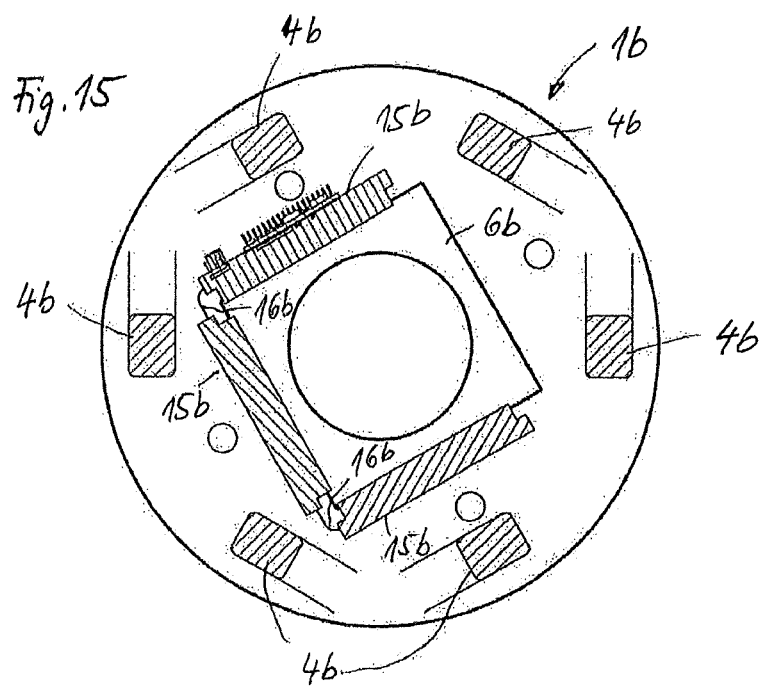

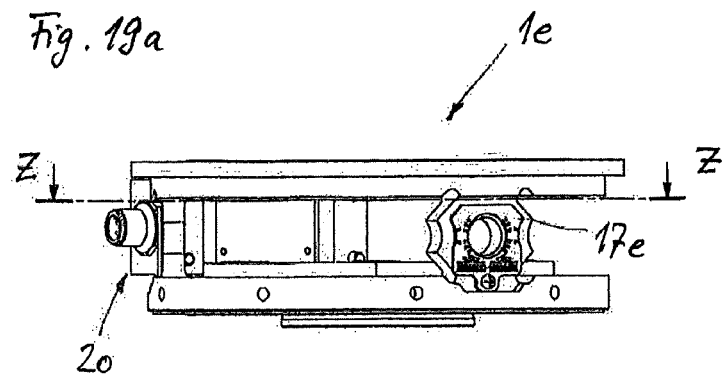
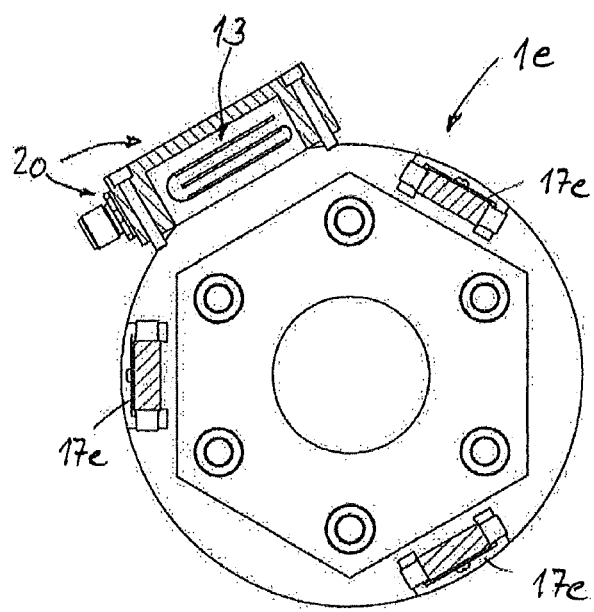

FORCE-TORQUE SENSOR AND STRAIN GAGE SYSTEM AND PRINTED CIRCUIT BOARD ARRANGEMENT FOR SUCH A FORCE-TORQUE SENSOR

The invention relates to a force-torque sensor for capturing forces and torques in a robotic unit, comprising a one-part carrier body which has a cylindrical basic shape and is provided with two connection disks parallel to one another and at least three bridge elements which connect the connection disks to one another and are each assigned at least one measuring point.

The invention also relates to a printed circuit board arrangement for such a force-torque sensor, comprising at least one electronic printed circuit board, on which electronic components are arranged, and comprising at least one connection printed circuit board which is connected to the at least one electronic printed circuit board via lines.

The invention also relates to a strain gage system for such a force-torque sensor, comprising at least one strain gage and comprising electrical connection surfaces.

GB 962 082 A discloses a force sensor which has a cylindrical rod. In order to increase the measuring effect, the rod is provided with cylindrical bores and with concave recesses. The bores and recesses have strain gages and act as measuring points of the force sensor.

A force-torque sensor is known from EP 0 261 071 A2. The force-torque sensor is used to capture forces and/or torques in a multiplicity of directions which are alternately orthogonal to one another between a drive element and an output element. The force-torque sensor has a one-part carrier body which is provided with two cylindrical connection disks on opposite sides. The force-torque sensor is provided for use in a robotic unit. The connection disks are used to be connected to corresponding elements of the robotic unit. The two cylindrical disks are connected to one another via polygonal bridge elements which are positioned in the region of the outer edges of the connection disks and extend in the vertical direction between the connection disks. The bridge elements are uniformly distributed over the circumference of the carrier body and merge into the two connection disks in one piece. Each bridge element has a central cylindrical bore which respectively defines a measuring point of the force-torque sensor. Strain gages are provided in the central cylindrical bore and are connected to electrical and electronic components via corresponding wiring.

In a practical embodiment of the force-torque sensor, the strain gages are individually applied manually to the corresponding measuring points and are wired to corresponding electrical and electronic components.

The object of the invention is to provide a force-torque sensor, a printed circuit board arrangement and a strain gage system of the type mentioned at the outset which enable improved accuracy when capturing forces and torques.

For the force-torque sensor, this object is achieved by virtue of the fact that each bridge element has a central cylindrical bore as a measuring point and is provided, on its opposite outer edges, with a respective concave recess at which a further measuring point is respectively provided. The number of measuring points in the force-torque sensor is increased by the concave recesses, thus making it possible to achieve a higher degree of accuracy for capturing forces and torques in a robotic unit.

In one configuration of the invention, each concave recess is partially cylindrical, all recesses each having the same radius. All central cylindrical bores of the bridge elements also each have the same radius, this radius being able to differ from the radii of the recesses. The dimensions of the central cylindrical bores of the bridge elements and of the concave recesses advantageously remain identical irrespective of the physical size of the respective force-torque sensor.

The object on which the invention is based is also achieved, in the case of a force-torque sensor, by virtue of the fact that the carrier body is provided, in the region of at least one connection disk on an inner side facing the other connection disk, with a supporting arrangement on which at least one printed circuit board arrangement provided with electronic components can be fixed in a manner oriented edgeways. The supporting arrangement may be embodied by means of at least one supporting bracket, by means of at least one supporting slot for accommodating the printed circuit board arrangement in a plugged manner, by means of a supporting block or the like. The important factor for the supporting arrangement is that the plate-shaped plate arrangement is positioned and supported with an edgeways orientation between the connection disks. The supporting arrangement can be provided in one piece on the connection disk or may be produced as at least one separate component which is connected to the inner end surface of the connection disk in a releasable or non-releasable manner. The supporting block may be in the form of a web or may be formed as a solid block in one piece on the carrier body. The supporting arrangement preferably has a contact surface for the printed circuit board arrangement, which contact surface is oriented orthogonally with respect to an end surface of the respective connection disk. The supporting arrangement may also have a plurality of contact surfaces or supporting surfaces for a plurality of printed circuit board arrangements, which surfaces are arranged in a manner distributed over the circumference of the carrier body. The upright, that is to say edgeways, orientation of the printed circuit board arrangement orthogonal to corresponding base areas or end surfaces of the connection disks ensures that the at least one printed circuit board arrangement is accommodated in a space-saving manner. As a result, there is sufficient space for guiding wiring or cabling or for different bore patterns in the region of the connection disks for the purpose of fastening to different robotic components.

In one configuration of the invention, the height of the printed circuit board arrangement is matched to a distance between the connection disks of the carrier body. The printed circuit board arrangement can therefore use the available installation space between the connection disks. The edgeways orientation corresponds to the upright orientation. The printed circuit board arrangement may be at a distance from at least one inner surface of a connection disk or may be in tactile contact with both inner surfaces of the two connection disks. The printed circuit board arrangement may also be fastened at the top and bottom to two supporting arrangements of the opposite connection disk. A height and a length of the printed circuit board arrangements are preferably matched to a smallest physical size of force-torque sensors. In the case of accordingly larger force-torque sensors, it is possible to use identical printed circuit board arrangements which then require less installation space inside the sensor in relation to the functional parts of a larger force-torque sensor.

This makes it possible to reduce the components and costs since identical prefabricated printed circuit board arrangements can always be used for force-torque sensors of different physical sizes.

In another configuration of the invention, the bridge elements are in the form of hexapod struts. This configuration is provided if the force-torque sensor is embodied according to the hexapod principle. In this case, a plurality of obliquely running struts which are assigned the measuring points are provided between the connection disks. These struts are preferably in one piece with the connection disks and are also referred to as hexapod struts.

The object on which the invention is based is also achieved by virtue of the fact that strain gages are provided at the measuring points and are each held in a prefabricated arrangement and grouping on a carrier film which is adhesively bonded to the respective bridge element in the region of the measuring points. The arrangement and grouping of the strain gages on a carrier film enables prefabrication of the carrier film, thus resulting in a prefabricated strain gage system which only has to be applied to the bridge element in a simple manner in the region of the corresponding measuring point. In addition to the possibility of exactly orienting the strain gages on the carrier film, a compact and space-saving arrangement also results. In addition, this makes it possible to achieve a full-bridge circuit of the strain gages, which produces considerably higher measuring amplitudes than a half-bridge circuit.

For the printed circuit board arrangement, the object on which the invention is based is achieved by virtue of the fact that at least two electronic printed circuit boards are connected to one another and/or at least one connection printed circuit board is connected to at least one electronic printed circuit board via at least one flexible connecting element in which the lines are integrated. This results in a printed circuit board arrangement which can be oriented in a variable manner and, for fixing, can be adapted to different physical sizes or configurations of force-torque sensors. As a result of the fact that corresponding electronic or electrical lines are integrated in the at least one flexible connecting element, the printed circuit board arrangement can be delivered in a fully prefabricated form for mounting on the corresponding force-torque sensor.

In one configuration of the printed circuit board arrangement, the at least one flexible connecting element extends continuously over an entire height of an adjacent electronic printed circuit board. The at least one flexible connecting element defines a bending or kink point in the form of a flexure hinge. In another configuration, the at least one flexible connecting element extends continuously along a side edge of a connection printed circuit board. Consequently, a corresponding connection printed circuit board can be bent relative to the adjacent electronic printed circuit board and electronic printed circuit boards are movable relative to one another. The electronic printed circuit boards and the connection printed circuit boards themselves are dimensionally stable.

In another configuration of the invention, the flexible connecting element can be bent in such a manner that the electronic printed circuit board and the at least one connection printed circuit board can be folded in a manner overlapping one another in a parallel manner. This enables a space-saving arrangement of printed circuit board arrangements inside a force-torque sensor or inside a plug connection part of a force-torque sensor.

For the strain gage system of the type mentioned at the outset, the object on which the invention is based is achieved by virtue of the fact that the at least one strain gage and the connection surface on a carrier film are oriented in a predefined longitudinal and transverse orientation relative to a film edge of the carrier film, and electrical line connections are applied to the carrier film and connect the connection surfaces to the at least one strain gage. The prefabrication of the strain gage system on a carrier film enables an exact spacing between a plurality of strain gages and an exact spacing and orientation of connection surfaces relative to the at least one strain gage. As a result of the fact that electrical line connections are applied to the carrier film, in particular by means of printing on, manual wiring effort is omitted. In addition, the electrical line connections are accommodated in a particularly space-saving manner as a result of the invention.

In one configuration of the strain gage system, at least two strain gages are provided and are connected to one another via electrical connecting lines which are applied to the carrier film. The electrical connecting lines define integrated connection of the at least two strain gages to one another.

In another configuration, the carrier film is provided with an adhesive layer, in particular a layer of glue, on an underside opposite the strain gages. This makes it possible to easily apply the carrier film to a corresponding surface of the measuring point in the region of the respective bridge element.

In another configuration of the invention, the carrier film is dimensioned in such a manner that the carrier film can be applied to the entire area in the region of the central bore or in the region of the concave recess of a bridge element. This makes it possible to safely fit the strain gage system in the region of a corresponding bridge element of a force-torque sensor.

Further advantages and features of the invention emerge from the claims and from the following description of preferred exemplary embodiments which are illustrated using the drawings.

Figure 2:
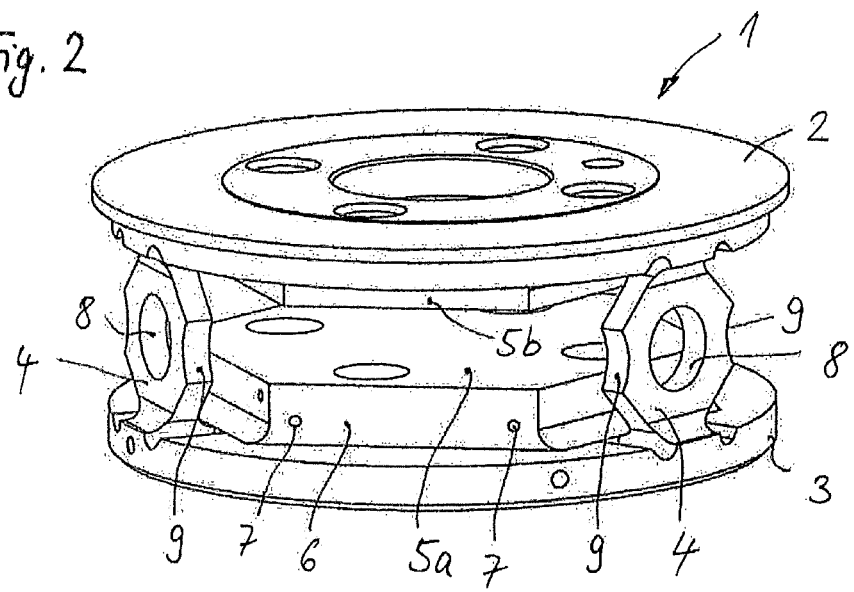
Figure 3:
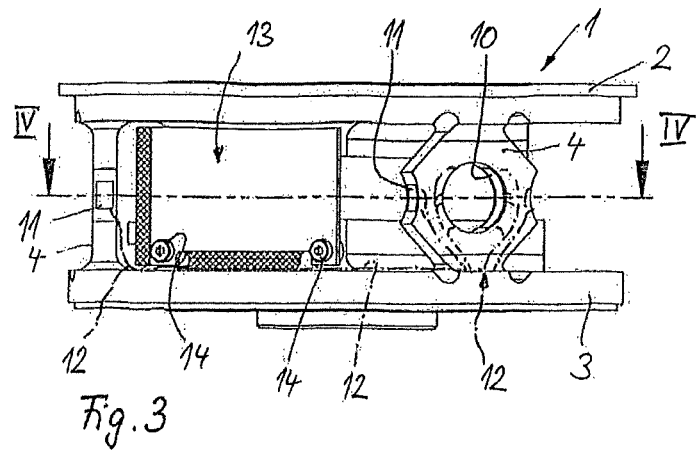
Figure 4:
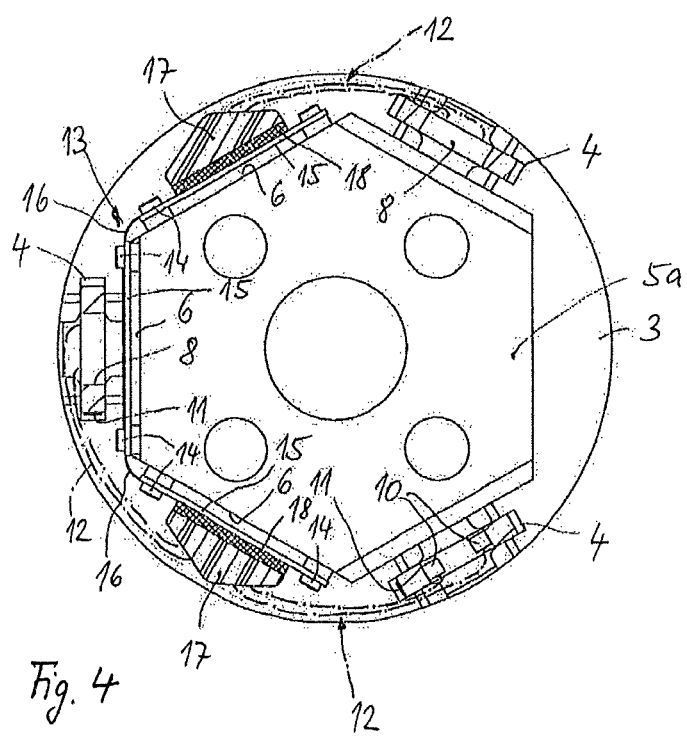
Figure 5:
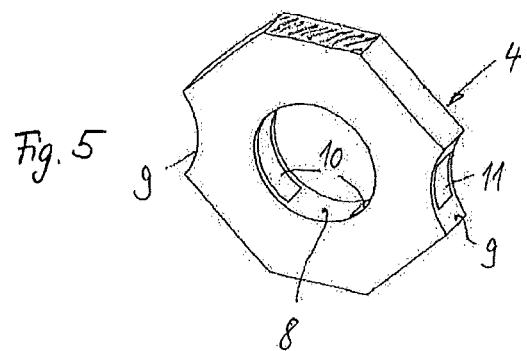
Figure 6:
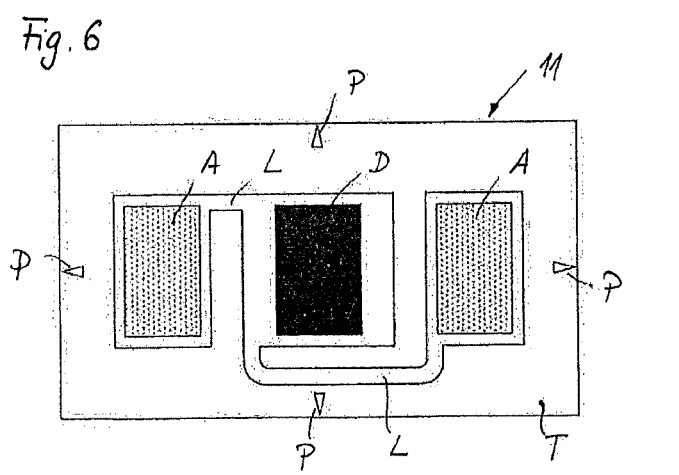
Figure 7:
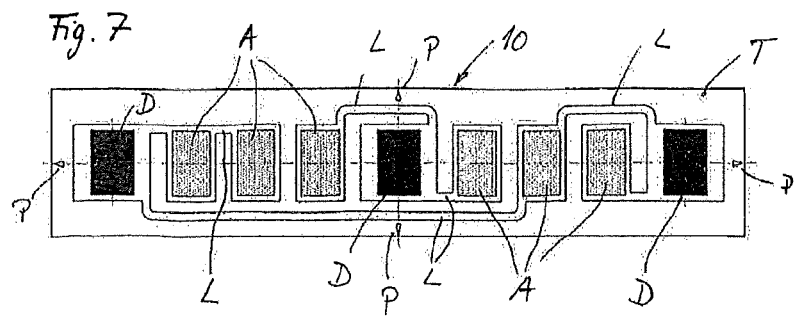
Figure 12:
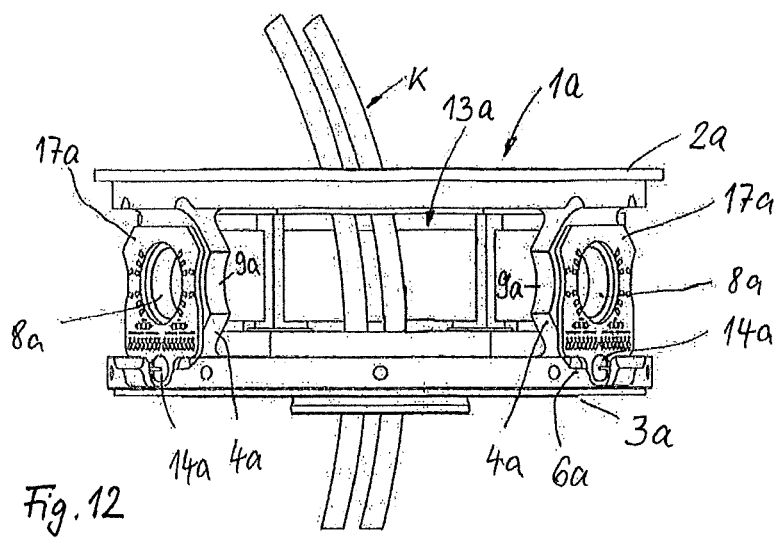
Figure 16:
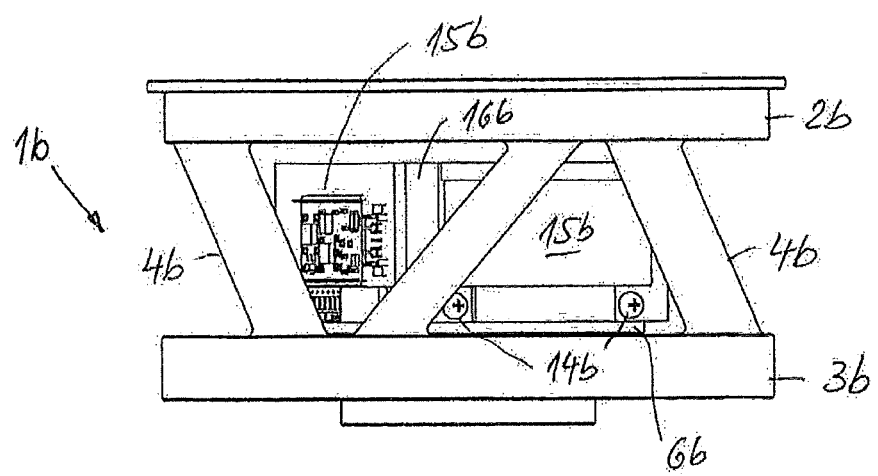
Figure 17A:
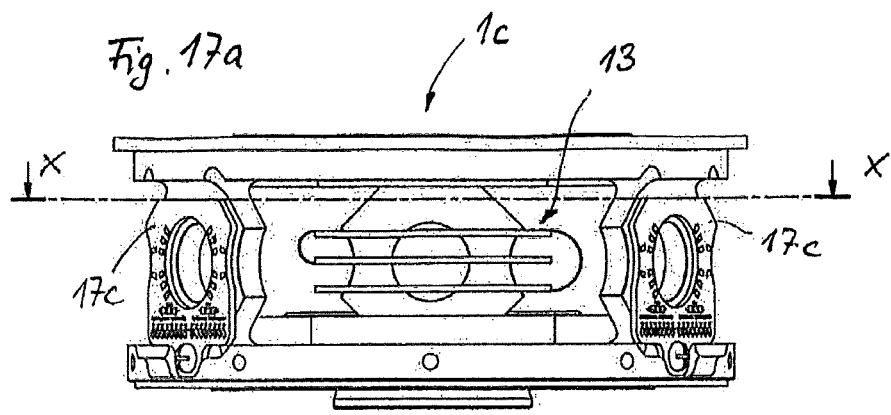
Figure 17B:
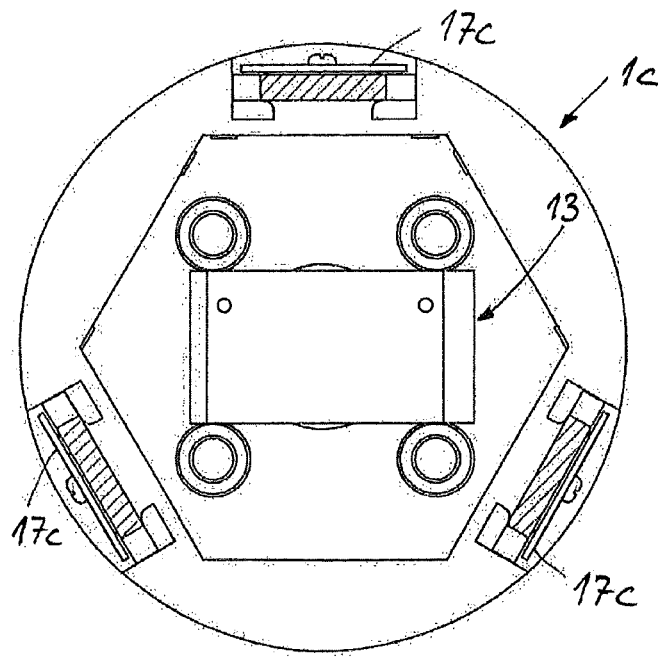
Figure 18A:
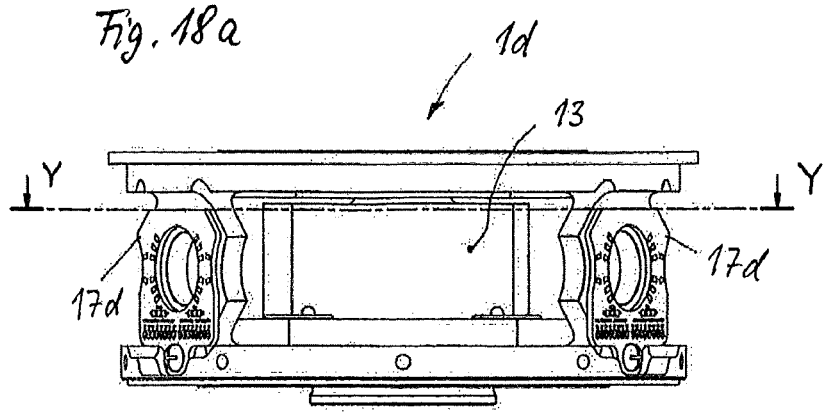
Figure 18B:
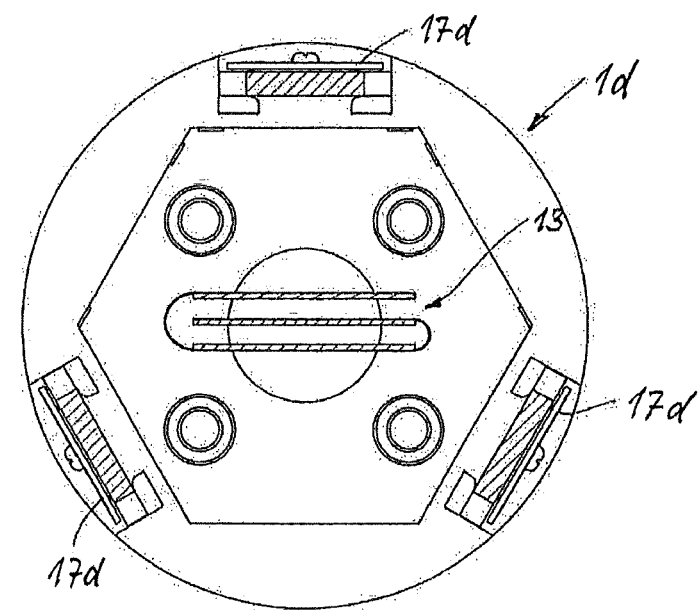

FIG. 1 shows a perspective illustration of a one-piece carrier body of one embodiment of a force-torque sensor according to the invention, FIG. 2 shows a different perspective of the carrier body according to FIG. 1, FIG. 3 shows a side view of the embodiment of the force-torque sensor according to the invention having a carrier body according to FIGS. 1 and 2, FIG. 4 shows a sectional illustration through the force-torque sensor along the section line IV-IV in FIG. 3, FIG. 5 shows an enlarged, perspective and cut-out illustration of a bridge element of the carrier body according to FIGS. 1 and 2 with applied strain gage systems, FIG. 6 shows an enlarged schematic illustration of one embodiment of a first strain gage system according to the invention, as is used in the force-torque sensor according to FIGS. 3 and 4, FIG. 7 shows an enlarged illustration of a further embodiment of a strain gage system according to the invention, as is used in the force-torque sensor according to FIGS. 3 and 4, FIG. 8 shows a front view of one embodiment of a printed circuit board arrangement according to the invention, as is used in the force-torque sensor according to FIGS. 3 and 4, FIG. 9 shows a plan view of the printed circuit board arrangement according to FIG. 8, FIG. 10 shows a side view of the printed circuit board arrangement according to FIGS. 8 and 9, FIG. 11 schematically shows a folded state of the printed circuit board arrangement according to FIGS. 8 to 10, FIG. 12 shows a further embodiment of a force-torque sensor according to the invention similar to FIGS. 1 to 11, FIG. 13 shows a view from below of the force-torque sensor according to FIG. 12, FIG. 14 shows a side view of a further embodiment of a force-torque sensor according to the invention in a hexapod embodiment, FIG. 15 shows a section through the force-torque sensor according to FIG. 14 along the section line XV in FIG. 14, FIG. 16 shows a further side view of the force-torque sensor according to FIGS. 14 and 15, FIGS. 17a and 17b show a side view and a sectional illustration of a further embodiment of a force-torque sensor according to the invention, FIGS. 18a and 18b show a side view and a sectional illustration of a further embodiment of a force-torque sensor according to the invention, and FIGS. 19a and 19b show a side view and a sectional illustration of a final embodiment of a force-torque sensor according to the invention.

A force-torque sensor according to FIGS. 1 to 4 is provided for the purpose of capturing forces and torques between different parts of a robotic unit in order to be able to avoid damage or overloading of the robotic unit. The force-torque sensor has a carrier body 1 which is produced in one piece and in solid form from metal. The carrier body 1 is created by means of machining from a solid metal block. The carrier body 1 has two substantially cylindrical connection disks 2 which are spaced apart and are parallel to one another and are each provided with connection geometries for connection to a corresponding robotic component. The two connection disks 2, 3 are connected to one another via three bridge elements 4 which extend in the vertical direction between corresponding edge regions of the connection disks 2, 3 and are arranged in a manner uniformly distributed over a circumference of the carrier body 1. Each bridge element 4 is in the form of a polygonal plate element. Each bridge element 4 is also provided with a central cylindrical bore 8 which is radially oriented with respect to a longitudinal center axis of the carrier body 1 extending in the vertical direction. Each bridge element 4 also has a respective concave recess 9 on opposite side edges. The concave recesses 9 are partially cylindrical and have radii which are identical to one another. The radii of the recesses 9 are greater than the radii of the central cylindrical bores 8. Corresponding center points of all central cylindrical bores 8 and center points of the arc-shaped or partially cylindrical curvatures of the recesses 9 of all bridge elements 4 are in a common center radial plane relative to the longitudinal center axis of the carrier body 1.

Each connection disk 2, 3 is also provided, on the inside, with a supporting block 5a, 5b facing the respective other connection disk 2, 3. Both supporting blocks 5a, 5b have a hexagonal base area. Both supporting blocks 5a, 5b have planar supporting surfaces 6 which protrude orthogonally with respect to the respective inner surface of the respective connection disk 2, 3. The supporting surfaces 6 of the lower supporting block 5a are also provided with fastening means in the form of threaded bores 7 which are discussed in more detail below. The two supporting blocks 5a, 5b are also one-piece sections of the carrier body 1. The connection disks 2, 3 and the supporting blocks 5a, 5b have passages for cable and line guides.

In the region of the respective central cylindrical bore 8 and in the region of the concave recesses 9 which are opposite one another in pairs on each bridge element 4, each bridge element 4 forms measuring points which are assigned strain gage systems 10, 11. Two strain gage systems 10 are respectively fitted in the region of an inner side of each central cylindrical bore 8, whereas one strain gage system 11 is respectively applied in the region of each recess 9. Each strain gage system 10, 11 is electrically connected, by means of wiring 12 which is illustrated only schematically using dash-dotted lines, to a printed circuit board arrangement 13 which is illustrated using FIGS. 8 to 11. The strain gage systems 10 and 11 are illustrated in more detail using FIGS. 6 and 7.

The strain gage system 11 according to FIG. 6 consists of an individual strain gage D and two connection surfaces A which are connected to the strain gage D via conductor tracks L. The strain gage D and the connection surfaces A in the form of solder connection surfaces are applied to a carrier film T which is flexible and is provided with a layer of glue on its underside. The carrier film T is matched to the dimensions of the respective concave recess 9 in order to be able to be applied over the entire area to a surface of the concave recess. In plan view, the carrier film T is rectangular. Both the strain gage D and the connection surfaces A are applied with their edge surfaces exactly parallel to corresponding side edges of the carrier film T and centrally oriented with respect to the carrier film T. The carrier film T has position marks P in order to make it possible to exactly orient the carrier film T on the surface of the corresponding recess 9.

The strain gage system 10 according to FIG. 7 likewise has a carrier film T which has a greater length than the carrier film T of the strain gage system 11. A total of three strain gages D and six connection surfaces 6A are accommodated on the carrier film T according to FIG. 7, which connection surfaces are connected to one another and to the strain gages D via conductor tracks L. It can also be seen from FIG. 7 that the strain gages D are also prewired to one another via the conductor tracks L to form a bridge circuit. Both the conductor tracks L and the connection surfaces A and the strain gages D are applied to the flexible carrier film T in a two-dimensional manner. The connection surfaces A of the strain gage system 10 according to FIG. 7 are in the form of solder connection surfaces in the same manner as the connection surfaces A according to FIG. 6.

Two such strain gage systems 10 are applied opposite one another in an exactly mirror-symmetrical manner to the inner surface of the central cylindrical bore 8, as can be seen from FIG. 5. FIG. 5 illustrates a bridge element 4 which has been cut free.

The wiring 12 is connected to the described connection surfaces A by means of soldering. The opposite end regions of the wiring 12 are connected to the printed circuit board arrangement 13 in an electrically conductive manner in a way described in more detail below. The printed circuit board arrangement 13 is used to amplify measurement signals from the strain gage systems 10 and 11. The printed circuit board arrangement 13 according to FIGS. 3, 4 and 8 to 11 has three dimensionally stable electronic printed circuit boards 15 to which corresponding electronic components are applied, which electronic components are needed to achieve the desired measuring amplification. The three electronic printed circuit boards 15 are connected to one another via flexible connecting elements 16 which are in the form of flexible connecting strips. The connecting elements 16 connect adjacent edge regions of the electronic printed circuit boards 15 to one another. In addition, electrical lines are integrated in the flexible connecting elements 16 and electrically connect the adjacent electronic printed circuit boards 15 to one another.

The printed circuit board arrangement 13 also has two dimensionally stable connection printed circuit boards 17 which are triangular in the embodiment according to FIGS. 8 to 10, whereas the electronic printed circuit boards 15 are substantially rectangular. Each connection printed circuit board 17 is connected to the associated electronic printed circuit board 15 via a further flexible connecting element 18. Like the flexible connecting elements 16, the flexible connecting elements 18 are in the form of tabs. Electrical lines which electrically connect the connection printed circuit board 17 to the electronic components of the respective electronic printed circuit board 15 are also integrated in the connecting elements 18. The respective connection printed circuit board 17 is provided with electrical connection points to which the wiring 12 is electrically connected in a suitable manner, in particular by means of soldering. The assignment of the wiring 12 to the two connection printed circuit boards 17 is schematically illustrated using FIG. 4. In this case, it can be seen that the measuring points of two bridge elements 4 are connected to the one connection printed circuit board 17, whereas the measuring points of the third bridge element 4 are connected to the other connection printed circuit board 17. The respective printed circuit board arrangement 13 is fastened to the corresponding planar supporting surface 6 of the respective supporting block 5a, 5b in an edgeways orientation with the aid of mechanical fastening elements in the form of fastening screws 14, the fastening screws 14 being screwed into the threaded bores 7.

It can be seen from FIG. 11 that the flexibility of the connecting elements 16 in the form of tabs is such that the electronic printed circuit boards 15 can be folded on top of one another in a parallel manner in order to thus enable compact storage of the printed circuit board arrangement 13. The flexibility of the orientation of the printed circuit board arrangement 13 ensures adaptation of the printed circuit board arrangement 13 to different physical sizes and configurations of force-torque sensors.

According to the invention, force-torque sensors according to FIGS. 3 and 4 can be produced in different physical sizes. However, in the case of all such force-torque sensors of different physical sizes, the diameters of the central cylindrical bores 8 and the radii of the concave recesses 9 remain identical to one another, with the result that corresponding strain gage systems 10, 11 need not be newly manufactured for each physical size, but rather identical strain gage systems 10, 11 can be used for the different physical sizes of force-torque sensors. The thickness of the bridge elements and the distances between the center points of the radii of the bores and the adjacent recesses are variable, depending on the sensor physical size. This does not influence the use of identical strain gage systems.

Figure 13:
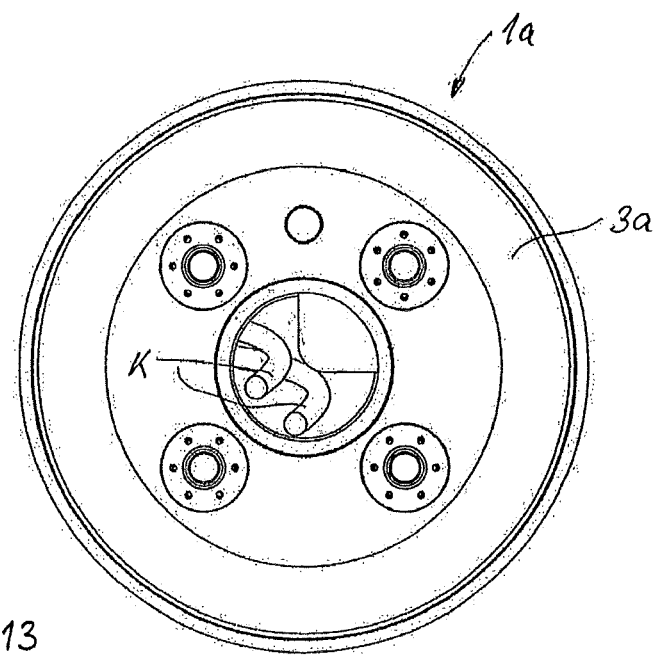

The force-torque sensor 1a according to FIGS. 12 and 13 corresponds substantially to the exemplary embodiment described above. In order to avoid repetitions, reference is therefore additionally made to the embodiment described above. Functionally identical components or sections are provided with the same reference symbols with the addition of the letter a. The force-torque sensor 1a has an upper connection disk 2a and a lower connection disk 3a which are connected to one another in one piece via a plurality of bridge elements 4a. The fundamental difference from the embodiment according to FIGS. 1 to 11 is that corresponding connection printed circuit boards 17a which receive the measurement signals from the strain gage systems and are connected to the at least one printed circuit board arrangement 13a via lines are directly accordingly assigned to radially outer front sides of the bridge elements 4a. The printed circuit board arrangement 13a comprises at least one electronic printed circuit board which is oriented edgeways and on which electronic components for amplifying and processing the measurement signals from the strain gages are arranged. Each connection printed circuit board 17a is dimensionally stable in the form of a plate and its outer contour is matched to an outer contour of the respective bridge element 4a. Each connection printed circuit board 17a also has a circular passage which is aligned with the cylindrical bore 8a of the respective bridge element 4a. The respective connection printed circuit board 17a is fastened to a fastening surface 6a of an outer edge of the lower connection disk 3a in an orientation which is edgeways and is parallel to the front side of the respective bridge element 4a by means of a respective mechanical fastening means 14a, in the present case in the form of a fastening screw.

As a result of the fact that the respective connection printed circuit board 17a is positioned directly in the region of the measuring points, it is possible to guide corresponding wiring, which branches off from the respective strain gage system in the region of the concave recesses 9a and in the region of the cylindrical bores 8a, directly to corresponding connection points of the connection printed circuit board 17a with an extremely short path. Corresponding connection points of the connection printed circuit board are each provided directly adjacent to the respective strain gage system of the bore 8a or the recess 9a. Connection outgoers of each connection printed circuit board 17a, which are then assigned to lines to the electronic printed circuit boards of the printed circuit board arrangement 13a, can be positioned in a row beside one another in the region of a lower or upper edge of the connection printed circuit board 17a in order to enable simple and space-saving line connection.

As a result of the edgeways orientation, additional space is produced in the radially inner region of the force-torque sensor 1a. This enables radially inner feedthrough of cables K. For this purpose, not only the upper connection disk 2a but also the lower connection disk 3a has a circular passage.

The force-torque sensor 1b according to FIGS. 14 to 16 is configured according to the hexapod principle. This means that the force-torque sensor 1b likewise has two connection disks 2b, 3b which are connected to one another in one piece via obliquely extending hexapod struts 4b. In the case of the force-torque sensor 1b as well, functionally identical components and sections are provided with the same reference symbols as in the embodiment according to FIGS. 1 to 11, but with the addition of the letter b. As can be clearly seen from FIGS. 14 and 16, the hexapod struts 4b each extend in opposite directions at the same angle upward and downward between the connection disks 2b, 3b and are uniformly distributed over the circumference of the force-torque sensor 1b. The lower connection disk 3b is provided with a supporting block in an identical manner to the lower connection disk 3 according to the embodiment according to FIGS. 1 to 11. The supporting block projects upward from a top side of the lower connection disk 3b, has a square base area and is provided, in the region of its outer edge, with planar supporting surfaces 6b which are oriented at a right angle with respect to one another, project vertically upward and on which at least one printed circuit board arrangement 13b is held in an upright position. For this purpose, mechanical fastening elements in the form of screw connections 14b are provided and secure the printed circuit board arrangement 13b to the supporting surfaces 6b. The supporting block is provided, on the inside, with a circular passage which is aligned with a circular passage of the upper connection disk 2b in order to enable corresponding cable feedthrough (FIG. 15). The printed circuit board arrangement 13b has both a plurality of electronic printed circuit boards 15b and corresponding flexible connecting elements 16b which form corner connections between two electronic printed circuit boards 15b in each case (FIG. 15).

Corresponding strain gage systems are fitted in the region of the hexapod struts 4b in a manner which is not illustrated in any more detail. The strain gage systems are similarly connected to connections of the printed circuit board arrangement 13b via wiring, line guides and the like. The connections may be formed by connection printed circuit boards, as has been described in more detail using the embodiment in FIGS. 1 to 11.

All embodiments according to FIGS. 1 to 16 have, in the region of the two connection disks, cylindrical passages which are coaxial with respect to a longitudinal center axis of the force-torque sensor 1b and make it possible to feed through cables.

The force-torque sensors 1c to 1e according to FIGS. 17a, 17b, 18a, 18b, 19a and 19b correspond substantially to the embodiment of a force-torque sensor 1 described above using FIGS. 1 to 11 with the difference that corresponding connection printed circuit boards 17c, 17d and 17e are each directly positioned on corresponding bridge elements on the front side, as is the case in the embodiment according to FIGS. 12 and 13. In order to avoid repetitions, reference is therefore made to the above descriptions of the embodiments according to FIGS. 1 to 13 with regard to corresponding functional sections and functional parts. The differences between the force-torque sensors 1c to 1e and the force-torque sensors 1 and 1a according to FIGS. 1 to 13 are discussed below.

In all three force-torque sensors 1c to 1e, dimensionally stable connection printed circuit boards 17c to 17e are arranged directly adjacent to corresponding strain gage systems of the bridge elements of the force-torque sensors 1c to 1e. Each of the force-torque sensors 1c to 1e has a printed circuit board arrangement 13, as illustrated using FIG. 11. The respective printed circuit board arrangement 13 consists of three electronic printed circuit boards 15 and two flexible connecting elements 16 in which corresponding lines are integrated. The fundamental difference to the embodiments according to FIGS. 1 to 13 is that the printed circuit board arrangement 13 in the force-torque sensors 1c to 1e is respectively positioned and fastened on the force-torque sensor 1c to 1e in a state which is folded in a compact manner. In the embodiment of the force-torque sensor 1c according to FIGS. 17a and 17b, the printed circuit board arrangement 13 is positioned and secured in a horizontal orientation. Corresponding wiring to the three connection printed circuit boards 17c, which forms corresponding connecting lines, is not illustrated.

In the embodiment according to FIGS. 18a and 18b, the printed circuit board arrangement 13 is positioned in an orientation which is upright but is folded in a parallel manner between the mutually facing inner sides of the two connection disks of the force-torque sensor 1d and is fixed in this orientation. In the force-torque sensor 1e according to FIGS. 19a and 19b, the printed circuit board arrangement 13 is moved from the interior of the force-torque sensor 1e. In this case, the printed circuit board arrangement 13 is positioned and secured in a compact orientation folded in a parallel manner in a receiving space of a plug connection part 20 which is flanged to a circumference of the force-torque sensor 1e. The plug connection part 20 has a plug outgoer and is releasably connected, including a housing surrounding the receiving space for the printed circuit board arrangement 13, to an outer contour of the force-torque sensor 1e by means of screw connections.

Both in the force-torque sensor 1d and in the force-torque sensor 1e, the corresponding connection printed circuit boards 17d, 17e are connected to the printed circuit board arrangement 13 via corresponding lines, in particular by means of wiring. In the force-torque sensor 1e, corresponding line outgoers of the printed circuit board arrangement 13 are connected to the plug outgoer in an electrically conductive manner. In the other force-torque sensors 1c and 1d, corresponding plug outgoers and corresponding line connections are provided between the plug outgoers and the respective printed circuit board arrangement 13, but are not illustrated.

The invention claimed is:

1. A force-torque sensor for capturing forces and torques in a robotic unit, comprising a one-part carrier body which has a cylindrical basic shape and is provided with two connection disks parallel to one another and at least three bridge elements which connect the connection disks to one another, wherein each bridge element has an outer edge, a central cylindrical bore as a first measuring point, and on the outer edge a concave recess at which a second measuring point is provided,
wherein the carrier body includes, in a region of at least one connection disk on an inner side facing the other connection disk, a supporting arrangement configured to receive at least one printed circuit board arrangement provided with electronic components, in a manner oriented edgeways.

2. The force-torque sensor as claimed in claim 1, wherein each concave recess is partially cylindrical, all recesses each having the same radius.

3. The force-torque sensor as claimed in claim 1, wherein the supporting arrangement is configured to support a printed circuit board having a height substantially equal to the distance between inner sides of the connection disks of the carrier body.

4. The force-torque sensor as claimed in claim 1, wherein the bridge elements are in the form of hexapod struts.

5. The force-torque sensor as claimed in claim 1, wherein strain gages are provided at the measuring points and are each held in a prefabricated arrangement and grouping on a carrier film which is adhesively bonded to the respective bridge element in a region of the measuring points.

6. The force-torque sensor as claimed in claim 1, further comprising at least one electronic printed circuit board, on which electronic components are arranged, and comprising at least one connection printed circuit board which is connected to the at least one electronic printed circuit board via lines, wherein at least two electronic printed circuit boards are connected to one another and/or at least one connection printed circuit board is connected to at least one electronic printed circuit board via at least one flexible connecting element in which the lines are integrated.

7. The force-torque sensor as claimed in claim 6, wherein the at least one flexible connecting element extends continuously over an entire height of an adjacent electronic printed circuit board.

8. The force-torque sensor as claimed in claim 6, wherein the at least one flexible connecting element extends continuously along a side edge of a connection printed circuit board.

9. The force-torque sensor as claimed in claim 6, wherein the flexible connecting element can be bent in such a manner that the electronic printed circuit boards and/or the at least one connection printed circuit board can be folded in a manner overlapping one another in a parallel manner.

10. The force-torque sensor as claimed in claim 1, further comprising at least one strain gage and comprising electrical connection surfaces, wherein the at least one strain gage and the connection surfaces on a carrier film are oriented in a predefined longitudinal and transverse orientation relative to a film edge of the carrier film, and in that electrical line connections are applied to the carrier film and connect the connection surfaces to the at least one strain gage or connect the strain gages to one another.

11. The force-torque sensor as claimed in claim 10, wherein at least two strain gages are provided and are connected to one another via electrical connecting lines which are applied to the carrier film.

12. The force-torque sensor as claimed in claim 10, wherein the carrier film is provided with an adhesive layer, in particular a layer of glue, on an underside opposite the strain gages.

13. The force-torque sensor as claimed in claim 10, wherein the carrier film is dimensioned in such a manner that the carrier film can be applied to the entire area in the region of the central bore or in the region of the concave recess of at least one of the bridge elements.

14. A force-torque sensor system comprising:
 a one-piece carrier body having a generally cylindrical shape and including a first connection disk and a second connection disk, the first connection disk and second connection disk being substantially parallel with respect to each other and connected by a first bridge element, a second bridge element, and a third bridge element which are spaced from each other, the first bridge element having a centrally located aperture defining a first measuring point and at least one concave edge surface defining a second measuring point, and a support arrangement between the first bridge element and the second bridge element configured to receive and hold a printed circuit board edgeways between the first connection disk and the second connection disk;
 a first strain gage system disposed at the first measuring point; and
 a second strain gage system disposed at the second measuring point.

15. The force-torque sensor system of claim 14, further comprising at least one electronic printed circuit board, on which electronic components are arranged, the electronic printed circuit board being supported by the support arrangement.

16. The force-torque sensor system of claim 15, further comprising at least one connection printed circuit board.

17. The force-torque sensor system of claim 16, wherein the at least one connected printed circuit is connected to the at least one electronic printed circuit board via at least one flexible connecting element.

* * * * *